United States Patent [19]
Beauducel

[11] Patent Number: 5,093,660
[45] Date of Patent: Mar. 3, 1992

[54] ACQUISITION METHOD AND DEVICE ALLOWING TO PRECISELY DIGITIZE ANALOG SIGNALS

[75] Inventor: Claude Beauducel, Henonville, France

[73] Assignee: Institut Francais Du Petrole, Rueil-Malmaison, France

[21] Appl. No.: 544,884

[22] Filed: Jun. 28, 1990

[30] Foreign Application Priority Data

Jun. 28, 1990 [FR] France ............................ 89 08758

[51] Int. Cl.$^5$ ............................................. H03M 1/18
[52] U.S. Cl. .................................... 341/139; 341/155
[58] Field of Search ............... 341/122, 126, 139, 141, 341/138, 155, 156, 158, 159, 160; 307/358, 359; 364/571.02

[56] References Cited

FOREIGN PATENT DOCUMENTS 2625634 12/1987 France .

Primary Examiner—A. D. Pellinen
Assistant Examiner—Brian Young
Attorney, Agent, or Firm—Antonelli, Terry, Stout & Kraus

[57] ABSTRACT

A method and device for acquiring signals by amplifying, sampling and digitizing for permanently controlling the stability of the gain at each successive sampling cycle carried out on the signals as disclosed. A first digitizing of a non amplified signal sample and at least a second digitizing of an amplified signal sample is performed at each cycle. Each gain is measured by establishing a ratio between the values respectively obtained at the end of each second digitizing and of the first digitizing, and the amplifier gain is corrected if the gain of each gain actually applied to the acquired signal has deviated from a nominal value. The invention has an application to the digitizing of seismic signals.

13 Claims, 2 Drawing Sheets

ACQUISITION METHOD AND DEVICE ALLOWING TO PRECISELY DIGITIZE ANALOG SIGNALS

BACKGROUND OF THE INVENTION

The present invention is a method and a device for acquiring analog signals and converting the analog signals to digital signals with high precision.

Acquiring analog signals and converting them into digital signals is carried out in many fields. For example in the seismic prospecting field analog signals are picked up by geophones or hydrophones resulting from underground reflections which are recorded in order to establish a representation of the subsoil. These reflections are generally amplified, sampled and digitized in order to be available for various subsequent signal processing. Seismic signals have very wide dynamic variation because of the variation of the explored areas. These dynamic variations often exceed the digitizing range of the analog to digital converters used for signal processing which work best with 16 bits.

A method allowing enlargement of the dynamic range of analog signals which may be digitized through digital to analog converter of the type comprising an input for applying a stable reference voltage is described in French Patent 2 625 634. The prior art method comprises connecting to the input a voltage generator producing two voltages of the same magnitude but of opposite polarity. According to the polarity of the input signal to be digitized, either the positive reference voltage or the negative voltage is applied. This method provides enlargement of the dynamic range.

French Patent 2 626 423 describes another dynamic range enlarging system for an analog to digital converter comprising a fixed gain amplifier, a sampler and an analog-to-digital converter (ADC) to which a fixed reference voltage, selected from a set of stable voltages obtained through subdivisions of the same calibrated voltage, is applied. Selecting the reference voltage is achieved by a comparison between the sampled analog voltages and the stable voltages derived from the calibrated voltage. Such a system provides good preciseness in digitizing relatively weak input signals which considerably enlarges the conversion range dynamics if the input signals to be digitized are not too small with respect to the noise level of the analog to digital converter.

Binary-gain amplifiers, which are used for seismic acquisition, are typically designed for delivering amplified signals defined by a floating point mantissa which is lower than the maximum voltage digitizable by the A-D converter, and an exponent which is generally a power of the number two. The resulting numeric words comprise a specified number of bits defining the digitized value of the mantissa and a binary digitized value of the exponent. Binary-gain amplifiers provide good results if the gain of the different amplification stages producing the bits of the exponent of the amplified voltage are precisely known. This is not always the case. The gain of the stages, as far as is known with great precision at the time of manufacturing because of the adjustment difficulties, is subject to variations caused by temperature variations and time. Gain jumps may occur, which decrease the preciseness of the digitized signal samples. The total linearity of the amplifier followed by the converter is generally different from that of the converter alone.

SUMMARY OF THE INVENTION

The method for acquiring analog signals according to the invention comprises amplifying analog signals, sampling the analog signals and digitizing the signal samples which provides high precision in the resulting digital words. The invention is characterized in a sequence of successive digitizing cycles, each cycle comprising:

directly digitizing a sample taken from a non amplified analog signal in order to obtain a first digitized value;

digitizing a sample of the analog signal which has been amplified with a nominal gain in order to obtain at least a second digitized value;

selecting a digitized value, measuring each nominal gain by determining a ratio between each second digitized value and said first digitized value and in case of a deviation in gain in relation to the corresponding nominal gain value;

adjusting each amplification gain applied through the amplifier to provide the nominal gain.

The first and the second digitized values are for example successively obtained within each cycle.

The device for acquiring analog signals according to the invention comprises an amplifier, a sampling means and at least one analog-to-digital converter for digitizing signal samples from said sampling means. The invention is characterized in that the amplifier comprises at least one amplification stage having means for adjusting the gain around a determined nominal value. The sampling means comprises a first sampler for directly sampling non amplified analog signals and at least one second sampler for sampling the signals from each amplification stage. Commutating means successively connect the sampler outputs to the input of the converter. Means are provided for selecting for each sample a digitized value and for correcting the gain of each amplification stage according to deviations measured between nominal gain and the real gain of the amplified signals.

The selecting and correcting means may comprise at least one voltage comparator for selecting at each cycle, from the signal samples from the sampler, those signal samples whose level is compatible with the converter, and a logical unit which determines at each cycle an amount proportionate to the deviation between the nominal gain values and the measured real gain values by establishing a ratio of the digitized values of the samples from each second sample and from the first sample, and means for weighting said deviation connected to said gain adjustment means.

The logical unit may comprise a first and a second shift register with both shift registers being connected to the output of the converter, and means for subtracting the contents of the first and of the second shift registers. The weighting means may comprise an integrator.

The weighting means comprises a processing unit for calculating an average value of the ratio between the nominal gain of each amplification unit and the real gain from the digitized values respectively contained in the first and in the second shift register. The processing unit may comprise a memory for a fixed number of successive values of said ratio.

BRIEF DESCRIPTION OF THE DRAWINGS

Other features and advantages of the method and of the device according to the invention will be clear from reading the description hereafter with reference to the accompanying drawings in which.

DESCRIPTION OF THE PREFERRED EMBODIMENTS

Figure 1:
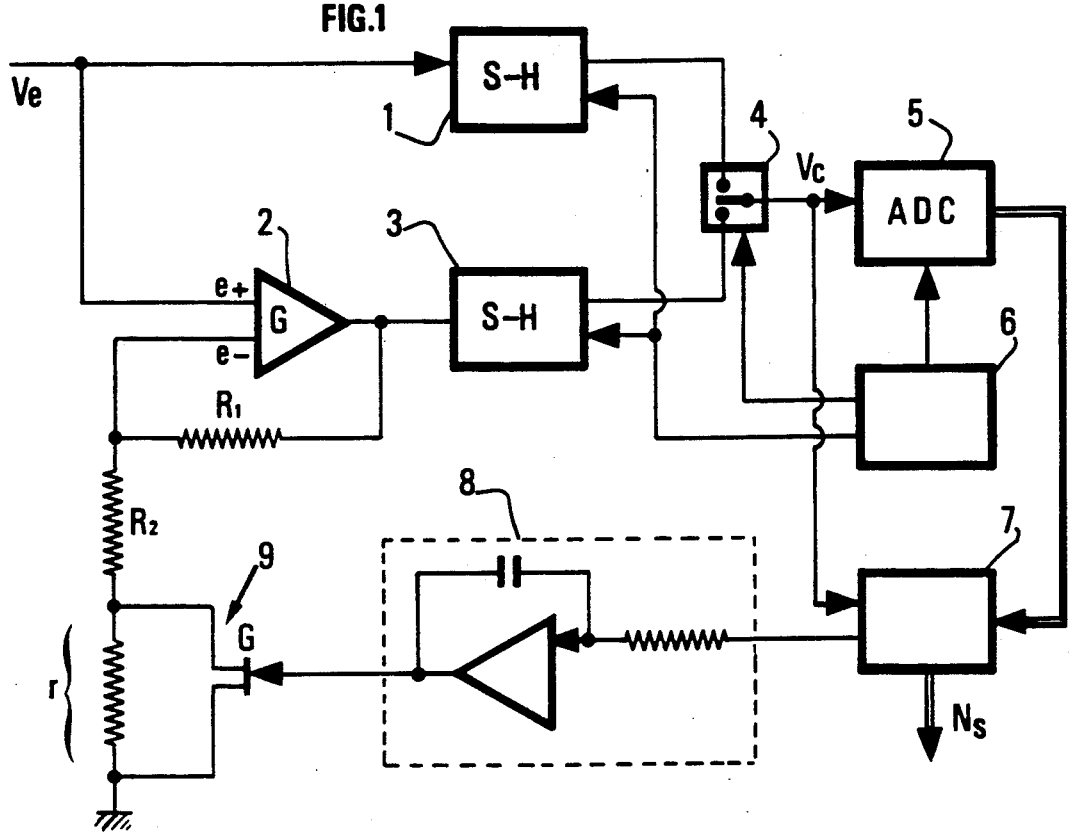
FIG. 1 shows a diagram of a first embodiment of a device according to the present invention utilizing an integrator for gain correction.

It can be seen in FIG. 1 that the analog signals Ve are applied at the input of a first sampler 1 and at the input of an amplifier 2 which provides a nominal g in Gn to the analog signal. The signal from amplifier 2 is applied to a second sampler 3. The outputs of the two samplers 1 and 3 are connected to two inputs of an electronic switch 4. The output of the electronic switch is connected to the input of an analog-to-digital converter 5 (A.D.C.) producing digital words of a given length for example of 16 bits. A synchronizing unit 6 produces clock signals to control samplers 1 and 3 and the ADC 5 at each sample digitizing cycle. The synchronizing unit produces at each cycle a signal for controlling switch 4 which successively controls application at the input of ADC 5 of the non amplified sample from sampler 1 and the amplified sample from amplifier 2.

The embodiment also comprises a logical unit 7 receiving the digitized words from converter 5 which produces correction signals as described below. The correction signals are applied at the input of an integrator 8. The gain of amplifier 2 is conventionally controlled through a feedback network comprising a first resistor R1 connected between the output and reversing input e− and the series connected resistors R2 and r for grounding the reversing input e−. Resistor r is connected in parallel with a FET transistor 9. The output of integrator 8 is connected to the gate of the FET transistor 9. The value of the effective resistance produced by resistor r and the transistor 9 varies according to the voltage applied to said gate.

Figure 2:
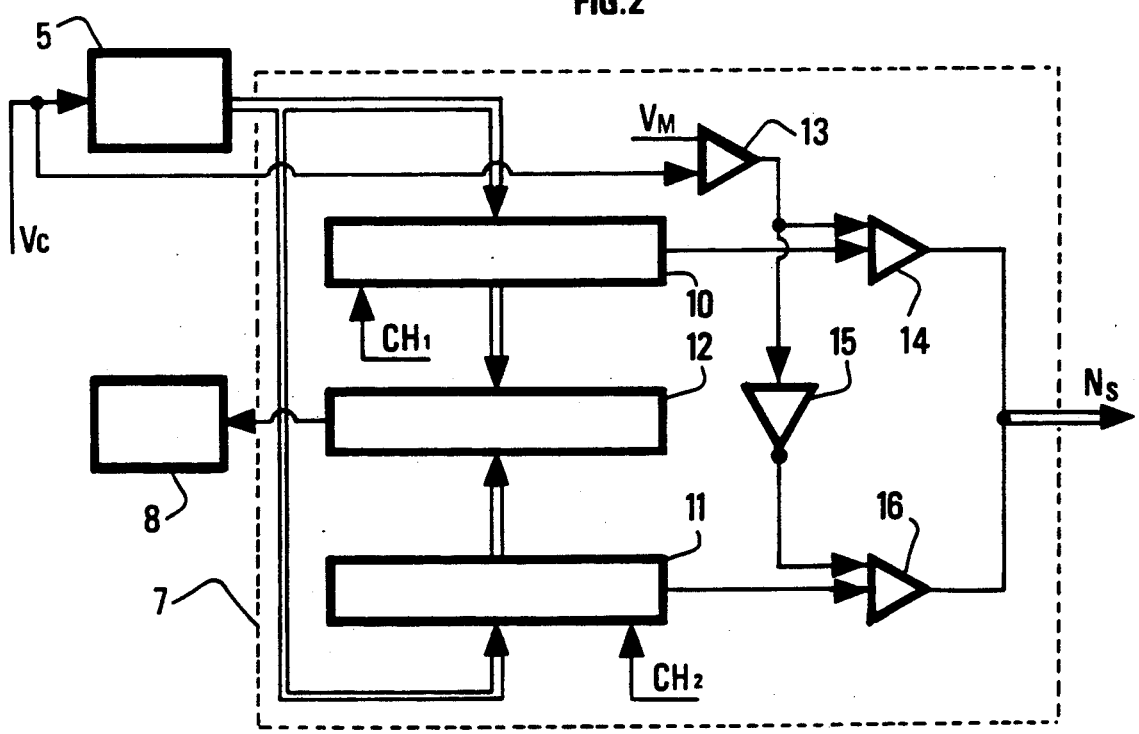
FIG. 2 shows a diagram of a logical unit providing the selection of the digital values and the possible adjustment of the amplification gains.

The control logical unit 7 is illustrated in FIG. 2. The control unit 7 comprises two registers 10 and 11 having inputs of which are connected in parallel to the outputs of ADC 5. A first pulse CH1 controls the application to register 10 of word N1 resulting from the digitizing of the non amplified sample. A second pulse CH2 controls application to register 11 of word N2 corresponding to the sample amplified with gain G. A subtractor 12 compares the respective contents of registers 10 and 11 and, according to the result of the comparison, produces a logical value signal 0 or 1 which is applied to integrator 8. The logical unit 7 also comprises a threshold 20 comparator 13 with two inputs. The first input of the comparator 13 is connected to the input of the ADC 5. A reference voltage Vm, corresponding to the maximum amplitude which the ADC 5 may convert into a digital word, is applied to the second input of the comparator 13. The output of threshold comparator 13 is connected to the control input of a first AND gate 14 and through a logical inverter 15 to the control input of a second gate AND 16. The respective outputs of registers 10 and 11 are respectively connected to the inputs of gates AND 14 and 16. The interconnected outputs of the two gates AND 14 and 16 are the output of the comparison unit.

The general working principle of the invention for each sampling cycle performs a double digitization, the first digitization being the non amplified sample from sampler 1 and the second digitization being the amplified sample from sampler 3, in checking whether the real gain G of the amplifier 2 is in accordance with the nominal gain Gn by calculating the ratio between the respectively obtained numeric words N2 and N1 and correcting the possible gain difference. The comparison of gains G and Gn can be carried out in an equivalent way by comparing the numeric word N2 obtained after amplifying with the actual gain G with the word N1 to determine if the desired nominal Gn is applied.

For each analog sample stored in samplers 1 and 3 the outputs of samplers are successively connected to the input of ADC 5 by means of switch 4. The two resulting digital words are successively stored in register 10 of logical unit 7 for the first sampler 1 and in the register 11 for the second sampler 3. A first level comparison is performed. If the signal at the device input is so large an amplitude to exceed the maximum voltage that can be digitized by ADC 5 after gain G amplification, the comparison unit selects the first numeric word N1 corresponding to the non amplified sample. This is achieved by threshold comparator 13 which opens gate 14 and closes the other gate 16. In the opposite case, if the amplified signal is in the voltage window that can be digitized by the converter, the logical unit 7 performs a second comparison between the second digital word N2 and a third word N3 in order to check whether the real gain G applied to the amplified sample actually corresponds to the nominal gain Gn measured at the time of the final adjustment of the amplifier. This word N3 is obtained by multiplying digital word N1 (non amplified sample) by the nominal gain Gn stored in register 10. If the nominal gain is for example two raised to the power of m (where m is any integer), the multiplication amounts to an m-stage shifting of the content of the register containing the word N1, as it is well-known. The word N1*Gn in register 11 is applied like word N2 to subtractor 12 which thus forms the difference N2−N1*Gn or, which is equivalent to the difference N1(N2/N1−G) =N1(G−Gn).

The subtraction N2−N1*Gn−0 produced by subtractor 12, depending upon whether there is a difference, is processed into a logical 0 or a logical 1. The logical signal from subtractor 12 is applied to integrator 8. The resulting voltage variation at the output of integrator 8 slightly modifies the gain of amplifier 3 in order to give a gain corresponding to the nominal gain to it.

The output of the digital word N2 corresponding to the amplified signal is then controlled through AND gate 16.

Figure 3:
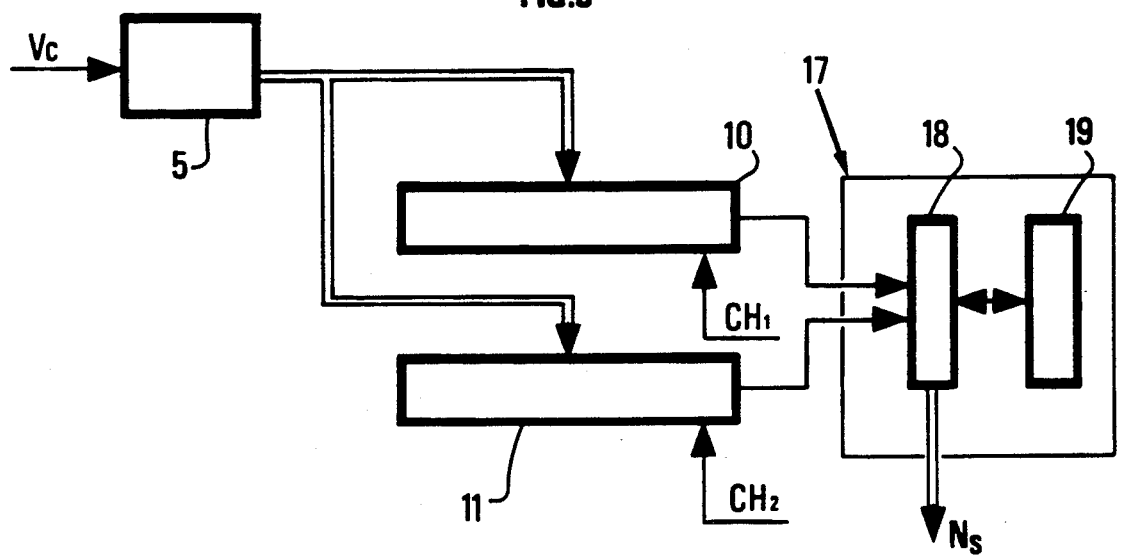
FIG. 3 shows a diagram of a second embodiment of a device according to the present invention where digital storage means are used for integrating the values of the gain corrections to be made in the amplification stages.

According to another embodiment shown in FIG. 3, the correction of the possible deviations between the real gain G of amplifier 3 and the nominal gain Gn is no longer performed by integration but instead by establishing an average value of their ratio with a certain number of successive sampling cycles. The real value of gain G being given by ratio N2/N1, the ratio GN/G between the nominal gain and the real gain is determined by calculating product C =Gn*N1/N2. Registers 10 and 11 of logical unit 7 are connected to a processing unit 17 comprising a computating element 18 for sampling and amplifying for determining the value of coefficient C and a memory 19, of for example of the well-known FIFO type, capable of storing a certain number p of digital words. The successive values of C are introduced into memory 19. At each cycle, the computating element 18 determines the average value of the p last stored values of coefficient C. The average value of the ratio is then utilized to modify the digitized value of each one of the successive samples. Computating element 18 performs this modification by multiplying by this average value the numeric word N2 corresponding to each amplified sample.

In the described embodiment, the case of an adjustable fixed gain amplifier has been considered. It would nevertheless remain within the scope of the invention to extend the described correction principle to an amplifier whose gain can have several different values with adjustment possibilities around thes values. In this case, the device can comprise for example several different gain stages in parallel, an analog-to-digital converter connected to each sampling cycle successively with all the stages by means of a multiplexer, means for correcting the deviations between the nominal gains of the different amplification stages and the real gains, similar to those which have been described previously, and means for selecting the gain of the stage giving the most precise digitized value in view of the utilized converter.

I claim:

1. A method for precisely digitizing an input analog signal by a series of successive digitization cycles each comprising:
    sampling said input analog signal and digitizing the signal sample by an analog-to-digital converter for obtaining a first digital word;
    amplifying the input signal with a predetermined gain by a amplifier having a gain which is adjustable around said predetermined gain;
    sampling the amplified input signal to produce an amplified signal sample and digitizing the signal sample by the analog-to-digital converter for obtaining a second digital word;
    selecting one of said first or second digital words within the range of said analog-to-digital converter;
    measuring an actual gain applied to said amplified signal sample by determining a ratio between said first digital, word and a corresponding second digital word; and
    adjusting said actual gain when different from said predetermined gain to produce an adjusted gain corresponding to said predetermined gain.

2. A method as claimed in claim 1 wherein:
    said first and second digital words are successively obtained within each cycle of the series of successive digitization cycles.

3. A device for precisely digitizing an input analog signal comprising:
    an amplifier for applying to said input analog signal a selected gain to produce an amplified signal;
    sampling means for sampling said input signal and said amplified input signal;
    analog-to-digital converter means for separately digitizing each sample of the input signal and the corresponding amplified input signal provided by the sampling means and providing therefrom respectively a first and a second digital words;
    gain adjusting means, coupled to said amplifier, for controlling the gain of the amplifier around a determined nominal value; and
    a logic assembly for selecting for each sample one of said digital words to compare the first and the second digital, words to determine an actual gain applied to the input signal and for activating the gain adjusting means when said actual gain is different from said nominal gain.

4. A device as claimed in claim 3 wherein the logic assembly comprises:
    a first and a second shift register means respectively for storing the first and the second digital words, means for multiplying the first word by said nominal gain by shifting said first word in the first shift register means to produce a third digital word, a subtractor for processing the second and third digital words to determine if the digital words differ, and weighting means, controlled by said subtractor means, for applying a gain correction to the gain adjusting means based upon said difference between the digital words so that a difference between said actual gain and said nominal gain is eliminated.

5. A device as claimed in claim 4 wherein said weighting means comprises:
    a integrator connected to said subtractor means.

6. A device as claimed in claim 3 wherein the logic assembly comprises:
    a processing unit for computing a ratio between each of said first word and a corresponding second word for averaging said ratio and for controlling said gain adjusting means in response to said average.

7. A device as claimed in claim 6 comprising:
    first and second register means for respectively storing each first and second digital word.

8. A device as claimed in claim 6 wherein the processing unit comprises:
    a memory for a fixed number of successive values of said ratio.

9. A device as claimed in claim 7 wherein the processing unit comprises:
    a memory for a fixed number of successive values of said ratio.

10. A device as claimed in claim 5 wherein said amplification means comprises:
    a feedback network having an electronically adjustable resistance coupled to an output of the integrator.

11. A device as claimed in claim 6 wherein:
    the processing unit includes means for correcting the digitized samples form said analog-to-digital converter means according to said averaged ratio.

12. A device as claimed in claim 7 wherein:
    the processing unit includes means for correcting the digitized samples from said analog-to-digital converter means according to said averaged ratio.

13. A device as claimed in claim 8 wherein:
    the processing unit includes means for correcting the digitized samples from said analog-to-digital converter means according to said averaged ratio.

* * * * *